United States Patent
Schenk et al.

(10) Patent No.: US 9,828,691 B2
(45) Date of Patent: Nov. 28, 2017

(54) SILICON BLOCK, METHOD FOR PRODUCING THE SAME, CRUCIBLE OF TRANSPARENT OR OPAQUE FUSED SILICA SUITED FOR PERFORMING THE METHOD, AND METHOD FOR THE PRODUCTION THEREOF

(71) Applicant: Heraeus Quarzglas GmbH & Co. KG, Hanau (DE)

(72) Inventors: Christian Schenk, Ingelheim (DE); Gerrit Scheich, Seligenstadt (DE); Nils-Christian Nielsen, Schlangenbad (DE); Walter Lehmann, Leipzig (DE); Bernhard Freudenberg, Coburg (DE); Kaspars Dadzis, Freiberg (DE); Sandra Nadolny, Freiberg (DE); Franziska Wolny, Dresden (DE); Gerd Fischer, Dohna (DE)

(73) Assignee: Heraes Quarzglas GmbH & Co. KG, Hanau (DE)

( * ) Notice: Subject to any disclaimer, the term of this patent is extended or adjusted under 35 U.S.C. 154(b) by 88 days.

(21) Appl. No.: 14/817,839

(22) Filed: Aug. 4, 2015

(65) Prior Publication Data
US 2016/0032483 A1    Feb. 4, 2016

(30) Foreign Application Priority Data

Aug. 4, 2014  (EP) .................................. 14179760
Aug. 29, 2014 (EP) .................................. 14182961

(51) Int. Cl.
C30B 11/00 (2006.01)
C03B 19/09 (2006.01)
(Continued)

(52) U.S. Cl.
CPC ............ *C30B 11/002* (2013.01); *C03B 19/09* (2013.01); *C30B 11/003* (2013.01); *C30B 29/06* (2013.01);
(Continued)

(58) Field of Classification Search
CPC .. C30B 9/00; C30B 9/04; C30B 11/00; C30B 11/002; C30B 11/003; C30B 29/00;
(Continued)

(56) References Cited

U.S. PATENT DOCUMENTS 5,053,359 A   10/1991  Loxley et al.
8,920,878 B2  12/2014  Werdecker et al.
(Continued)

FOREIGN PATENT DOCUMENTS

DE   19943103 A1   3/2001
DE   10344189 A1   2/2005
(Continued)

OTHER PUBLICATIONS

English translation of Office Action dated Jun. 27, 2016 in JP Application No. 2015-153375.
(Continued)

*Primary Examiner* — Kenneth A Bratland, Jr.
(74) *Attorney, Agent, or Firm* — Panitch Schwarze Belisario & Nadel LLP

(57) ABSTRACT

A method for producing a solar crucible includes providing a crucible base body of transparent or opaque fused silica having an inner wall, providing a dispersion containing amorphous $SiO_2$ particles, applying a $SiO_2$-containing slip layer to at least a part of the inner wall by using the dispersion, drying the slip layer to form a $SiO_2$-containing grain layer and thermally densifying the $SiO_2$-containing grain layer to form a diffusion barrier layer. The dispersion contains a dispersion liquid and amorphous $SiO_2$ particles
(Continued)

Figure 1:
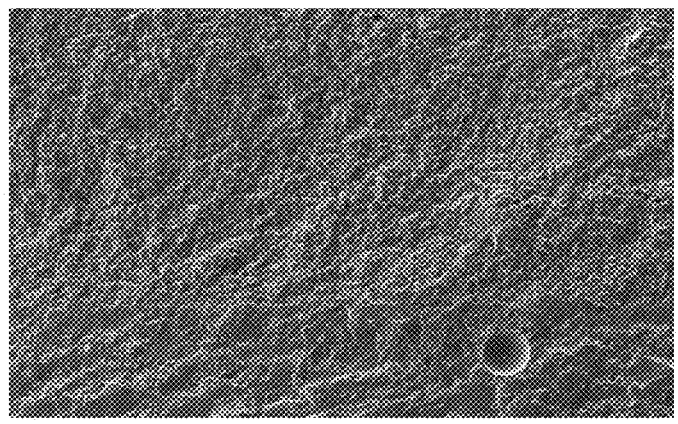

that form a coarse fraction and a fine fraction with $SiO_2$ nanoparticles. The weight percentage of the $SiO_2$ nanoparticles based on the solids content of the dispersion is in the range between 2 and 15% by weight. The $SiO_2$-containing grain layer is thermally densified into the diffusion barrier layer through the heating up of the silicon in the crystal growing process.

8 Claims, 3 Drawing Sheets

(51) Int. Cl.
  *C30B 35/00* (2006.01)
  *C30B 29/06* (2006.01)
(52) U.S. Cl.
  CPC ........ *C30B 35/002* (2013.01); *C03B 2201/03* (2013.01)
(58) Field of Classification Search
  CPC ......... C30B 29/02; C30B 29/06; C30B 35/00; C30B 35/002; C03B 19/00; C03B 19/06; C03B 19/063; C03B 19/066; C03B 19/09; C03B 2201/00; C03B 2201/02; C03B 2201/03
  USPC ... 117/2–4, 7, 11, 73, 81–83, 101, 200, 204, 117/206, 219, 220, 223, 928, 931, 117/942–943
  See application file for complete search history.

(56) References Cited

U.S. PATENT DOCUMENTS

| | | | |
|---|---|---|---|
| 2004/0216486 | A1 | 11/2004 | Schwertfeger et al. |
| 2007/0082149 | A1* | 4/2007 | Linnot ................... B28B 1/261 428/34.4 |
| 2012/0160155 | A1* | 6/2012 | Sudo ..................... C03B 19/095 117/13 |
| 2012/0237685 | A1* | 9/2012 | Werdecker .............. C03C 17/02 427/379 |
| 2013/0015318 | A1 | 1/2013 | Wakita et al. |

FOREIGN PATENT DOCUMENTS

| | | |
|---|---|---|
| DE | 102009049032 B3 | 3/2011 |
| DE | 102011082628 A1 | 3/2013 |
| EP | 0949358 A2 | 10/1999 |
| FR | 2854398 A1 | 11/2004 |
| JP | 2013507309 A | 3/2013 |
| WO | 2005106084 A1 | 11/2005 |
| WO | 2007063996 A1 | 6/2007 |
| WO | 2012104948 A1 | 8/2012 |

OTHER PUBLICATIONS

European Search Report dated Mar. 26, 2015 in EP Application No. 14182961.4.

* cited by examiner

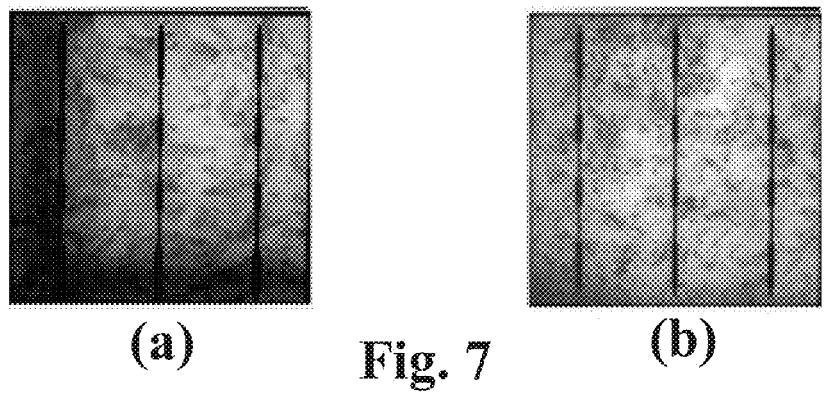
(a) Fig. 7 (b)
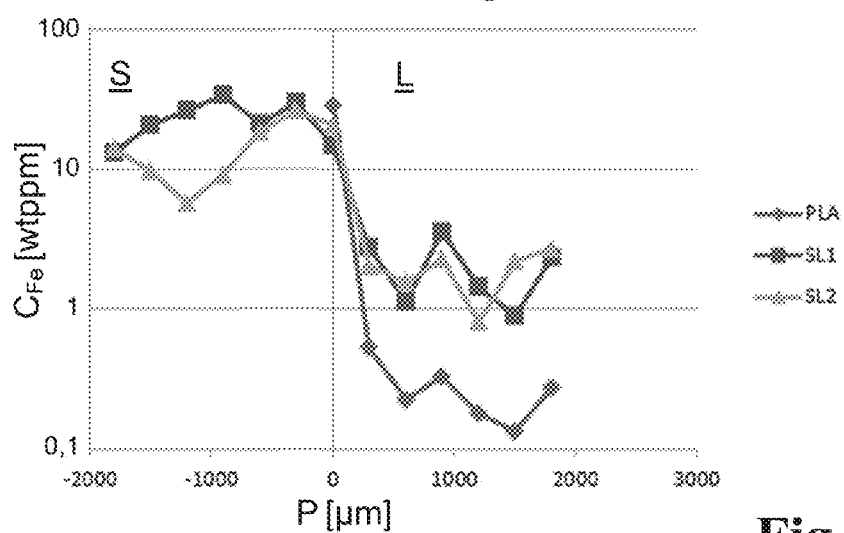
Fig. 8
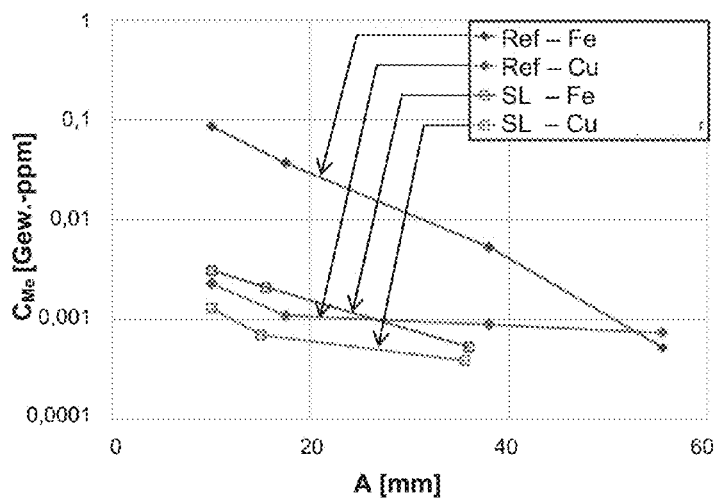
Fig. 9

SILICON BLOCK, METHOD FOR PRODUCING THE SAME, CRUCIBLE OF TRANSPARENT OR OPAQUE FUSED SILICA SUITED FOR PERFORMING THE METHOD, AND METHOD FOR THE PRODUCTION THEREOF

TECHNICAL FIELD

The present invention refers to a silicon block with a monocrystalline or polycrystalline structure.

Moreover, the present invention refers to a method for producing such a silicon block in a crystal growing process for silicon by providing a solar crucible with a crucible base body of transparent or opaque fused silica comprising an inner wall, of which at least a part is covered by a $SiO_2$-containing grain layer, the silicon being filled into the solar crucible, the silicon being heated so as to form a silicon melt, and the silicon melt being cooled down with crystallization and formation of the silicon block.

Furthermore, the present invention refers to a solar crucible with a rectangular shape for use in a crystal growing process, the crucible comprising a crucible base body of transparent or opaque fused silica comprising an inner wall, and a $SiO_2$-containing layer which covers the inner wall at least in part.

Moreover, the invention is concerned with a method for producing a solar crucible with a rectangular shape for use in a crystal growing process, comprising providing a crucible base body of transparent or opaque fused silica which comprises an inner wall, providing a dispersion containing amorphous $SiO_2$ particles, applying a $SiO_2$-containing slip layer with a layer thickness of at least 0.1 mm to at least a part of the inner wall by using the dispersion, drying the slip layer so as to form a $SiO_2$-containing grain layer and thermally densifying the $SiO_2$-containing grain layer so as to form a diffusion barrier layer.

PRIOR ART

Blocks of monocrystalline or polycrystalline silicon for solar applications are fused according to the Bridgman or Vertical Gradient Freeze (VGF) method in solar crucibles of transparent or opaque fused silica.

These solar crucibles are often produced with the help of ceramic slip methods and have a polygonal, in the simplest case, a rectangular, crucible opening. For reasons of costs the crucibles are predominantly produced from naturally occurring quartz raw material. Therefore, the purity of the crucible material is basically less than that of synthetically produced transparent fused silica. In the crystal growing process at least partial heating up to temperatures above 1,410° C. is carried out into the crucible wall. The impurities existing in the crucible wall cause crystallization with formation of cristobalite. During cooling, a structural transformation known as "cristobalite jump" leads to the destruction of the crucible, which can thus only be used once.

During cooling the silicon block shrinks more than the crucible. In case of adhesions to the crucible wall, stresses and cracks may occur in the silicon block. This is countered with separation layers of $Si_3N_4$, SiC, or the like.

Moreover, metallic impurities are also introduced from the crucible wall into the silicon in the crystal growing process. They are introduced by way of volume diffusion, surface diffusion or by evaporation of volatile metal compounds from the fused silica body, namely into the liquid silicon phase and also into the crystallized solid phase. In the past years the content of impurities has been reduced constantly and the main impurity iron, which is also representative of other metallic impurities such as e.g. Cr or Cu, has been lowered from about 100 wt. ppm to 10 wt. ppm. Iron impurities are however particularly critical as they impair the electronic properties of the semiconductor material and diffuse particularly easily.

Therefore, on the solidified silicon block (also called "ingot") one finds a region of increased Fe total concentration in the peripheral zone. This concentration is typically in the range of $10^{14}$ to $10^{16}$ at/cm$^3$. Under unfavorable circumstances the peripheral zone represents loss of material that significantly contributes to the manufacturing costs for solar cells. (Note: the literature frequently gives concentration data only for the iron interstitially dissolved in the silicon lattice, but the above data refer to the total concentration of iron).

The contamination can be deduced from the deteriorated electrical properties in the peripheral region. In the measurement by means of the minority-carrier charge carrier lifetime (LTDL) the bad region is shown in red and is therefore also called "red zone". Peripheral regions with reduced electrical cell efficiency are detected in the processed cell with the help of the photoluminescence measurement (PL) and are visible as dark regions.

To reduce the input of impurities from the crucible wall, the inner wall of the crucible is provided with diffusion barriers. A great number of methods are known for this.

It is e.g. suggested in DE 10 2011 082 628 A1 that the bottom and the sidewalls of the crucible should be covered with a diffusion barrier in the form of inserted plates of transparent fused silica of a high purity with thicknesses of e.g. 1 mm. The plates of transparent fused silica can additionally be provided on the inside with a $Si_3N_4$ layer to simplify the removal of the silicon block.

Open gaps that must be sealed remain between the individual plates and in the Peripheral region. There is a high risk of breakage for the plates due to irregularities in the crucible and point loads after silicon filling. Undefined thermal transitions arise from different support gap widths. Moreover, plates of transparent fused silica of a high purity are very expensive. High material costs and the mounting efforts make the manufacturing process expensive, especially for the provision of large-volume crucibles with widths of more than 0.5 m and wall heights of 0.25 m and more.

EP 0 949 358 A1 suggests a method for producing a crucible, in which a wax core in the form of the inner wall of the crucible is provided and a slip layer is applied thereto by dipping, the layer containing fine-grained $SiO_2$ particles with particle sizes of 40 µm as well as colloidal $SiO_2$. Fine fused silica sand of high purity with particle sizes of around 150 µm is sprinkled by addition onto the slip layer. Dipping and sprinkling are repeated until a layer thickness of 3 mm is reached. Coarse fused silica sand with particle sizes between 500 µm and 1500 µm of lower purity is sprinkled after repeated dipping into the slip. This process will, also be repeated until a layer thickness of 8 mm is reached. The layer composite produced thereby, which consists of an inner layer and an outer layer, is baked at a temperature of 800° C. for 2 hours after fusion of the wax core. In the crystal growing process it is only the inner layer that gets into contact with the silicon, adheres to the silicon block upon cooling and delaminates from the outer layer. The formation of mechanical stresses in the silicon block is thereby avoided.

A similar method is also known from WO 2005/106084 A1. It describes a coating of the bottom and the inner walls of a solar crucible base body with an aqueous slurry that contains $SiO_2$ particles of different sizes. The $SiO_2$ layer has a thickness of up to 500 μm and serves as an intermediate layer. The surface layer as such consists of $Si_3N_4$. Adhesion of the $SiO_2$ intermediate layer to the base body is deliberately kept low, so that it delaminates during cooling and the silicon block remains undamaged and is kept free from stresses as much as possible. The low adhesion of the intermediate layer is generated by conferring a certain porosity to said layer.

U.S. Pat. No. 5,053,359 A describes a sintered crucible of amorphous $SiO_2$ powder of high purity which has added to it as a dopant a crystallization promotor in the form of aluminum oxide. The aluminum oxide addition effects crystallization of the crucible wall during the melting process. Additions of crystallization promotors are also described for fused silica crucibles that are vitreously molten in the arc process, for instance in WO 2007/063996 A1. The crystal formation primarily serves to enhance the temperature stability. It is also noted that contaminations arising from the crucible wall can thereby be reduced.

DE 10 2009 049 032 B3 describes a method for producing a component of coated quartz glass—for example, a crucible—by spraying a $SiO_2$ containing slurry on a surface. The slurry contains both splintery and spherical amorphous $SiO_2$ particles and it contains $SiO_2$ nanoparticles with a weight fraction between 0.2 and 10% by wt. The particles consist of at least 99.99% by wt. of $SiO_2$. The cristobalite content is not more than 0.1% by wt. The slurry composition is optimized with respect to viscous flow for coating vertical and inclined surfaces by spraying.

OBJECT OF THE INVENTION

The last-mentioned patent refers to a fused silica crucible for the crystal pulling process according to the Czochralski method. The crucibles used therein are rotation-symmetrical and are fused in an arc process. After production of the base body a thin inner layer of high-purity $SiO_2$ is often applied thermally to the inside in an additional step so as to improve the surface quality. However, on account of their polygonal inner cross-section, the arc melting process is not suited for solar crucibles.

Solar crucibles are typically solidified by sintering in a sintering furnace. However, during sintering there is the risk that the sintering processes for densifying the crucible wall and possible crystallization processes overlap one another, thereby impeding the densification of the crucible wall, with a residual porosity remaining in the structure. In the case of a porous structure, however, impurities can particularly easily pass into the melting material.

These problems basically arise also during sintering of the diffusion barrier layers produced by using particulate start material according to the above-explained prior art, especially if these are thermally densified only during the crystal growing process; thus, it must be ensured not only that a sufficiently dense layer is created, but also that during the heating-up phase and the early melting phase the amount of impurities passing from the crucible wall into the melt is as small as possible.

It is not easy to satisfy these conditions, so that cells from the peripheral region of silicon blocks frequently still exhibit a dark cell edge, i.e. a zone of reduced efficiency when said edge is made visible by photoluminescence measurement.

It is therefore the object of the present invention to provide a silicon block of high purity and to indicate a method which permits an inexpensive manufacture of such a silicon block with a low loss of material.

Furthermore, it is the object of the present invention to provide a solar crucible that reliably satisfies this demand.

Moreover, it is the object of the present invention to provide an inexpensive method for producing such a solar crucible.

SUMMARY OF THE INVENTION

As for the method for producing the crucible by using a dispersion containing amorphous $SiO_2$ particles, this object starting from a method of the aforementioned type is achieved according to the invention in (a) that the dispersion contains a dispersion liquid and amorphous $SiO_2$ particles that form a coarse fraction with particle sizes in the range between 1 μm and 50 μm and a fine fraction with $SiO_2$ nanoparticles with particle sizes of less than 100 nm, wherein the weight percentage of the $SiO_2$ nanoparticles based on the solids content of the dispersion is in the range between 2 and 15% by wt., (b) and that the $SiO_2$-containing grain layer is thermally densified into the diffusion barrier layer through heating-up of the silicon in the crystal growing process.

For the above-explained reasons, particularly because of the crystallization tendency of the crucible base body and because of the high temperatures needed for densification, the preparation of a dense diffusion barrier layer from $SiO_2$-containing grain layer before the intended use of the crucible encounters difficulties. In the method according to the invention the $SiO_2$-containing grain layer is thermally densified into the diffusion barrier layer only in the crystal growing process.

Hence, a particular challenge of the method according to the invention consists in providing a $SiO_2$-containing grain layer which is free of impurities, if possible, and which upon heating up in the crystal growing process can be densified rapidly into a diffusion barrier layer that is as dense as possible. During heating up of the silicon in the crystal growing process the crucible wall reaches temperatures ranging between 1,370° C. and 1,450° C. The maximum temperature on the crucible wall is normally just above the melting temperature of silicon, but it may also be lower in the bottom area of the crucible.

This procedure offers the advantage of avoiding thermal stress of the crucible base body which might crystallize and form cracks in this process. To be more specific, cracks caused by the cooling process may arise subsequent to possible thermal coating processes. Therefore, the formation of the dense diffusion barrier layer during the silicon melting process has the advantage that it is created without the formation of cracks. The sintering of the green layer already starts at relatively low temperatures; a still open-pore sinter layer is first obtained. A significant densification which leads to a closed-pore formation of the sinter layer begins above the transformation range which, depending on the type of transparent fused silica of the grain layer, is in the temperature range of 1,000° C. to about 1,200° C. The densified sinter layer corresponds to the diffusion barrier layer; it can relax thermally introduced stresses and thereby counteract the formation of cracks. A precondition is that the diffusion barrier layer is vitreous-amorphous and does not crystallize. When the melting temperature for silicon is reached (1,410° C.), the vitreous-amorphous densified sinter layer has a viscosity (in the order of $10^{10}$ dPas), at which a significant plastic deformability is given.

To reduce the "red zone" in the silicon block significantly, small iron contents of less than 2 wt. ppm, preferably of less than 0.5 wt. ppm, are needed. It has been found that this requires not only a dense diffusion barrier layer, but the density of the diffusion barrier layer must also be provided as rapidly as possible during the heating up of the silicon charge, i.e. if possible, before the maximum temperature is reached in the crystal growing process.

Although sintering aids or binders might contribute to a rapid sintering of the grain layer, they would simultaneously introduce impurities into the slip layer and thereby promote the crystallization tendency of the layer and are therefore not suited. Nevertheless, to achieve a rapid and reliable densification of the diffusion barrier layer, the invention provides a particularly sinter-active grain layer. Its high sintering activity is achieved by way of a multimodal grain size distribution in the case of which amorphous $SiO_2$ particles with particle sizes in the range between 1 μm and 50 μm (coarse fraction) and $SiO_2$ nanoparticles (fine fraction) with a weight percentage between 2 and 15% by wt. are provided.

The sintering capacity of the grain layer depends particularly on the composition of the slip layer in the near-surface region. The distribution and the amount of $SiO_2$ nanoparticles are here decisive. A high amount yields an increased sinter activity that permits a thermal densification at a comparatively low temperature or during a short sintering period into a glass of enhanced density and reduced porosity. Ideally, only relatively fine $SiO_2$ particles are found in the near-surface region of the slip layer.

To come close to such a situation, the slip layer is given sufficient opportunity to segregate e.g. during the drying process. Within the slip layer produced, the segregation effects a division into a lower portion adjoining the inner wall of the crucible, in which the coarse fraction of the $SiO_2$ particles is predominantly found, and into an outer portion adjoining the free surface of the layer, in which the fine fraction is enriched. The fine fraction of the $SiO_2$ particles is formed by nanoparticles. Nanoparticles typically consist of a group of a few thousand $SiO_2$ molecules and normally have a specific BET surface area in the range of 50-400 m²/g. In contrast to the above-explained method according to EP 0 949 358 A2, in which several sublayers are produced, a single layer application is enough in the method according to the invention; the particles of different particle sizes are here separated by segregation and other physical effects; these shall be explained in more detail hereinafter.

Within the slip layer, an inhomogeneous particle size distribution will develop soon after application to the inner wall of the crucible, wherein the transition between lower and upper region in the green layer shows a perceivable shape under the microscope (the dried slip layer is here called green layer). Decisive parameters for a successful segregation are:

The initial liquid content of the slip—the content should be sufficiently high, preferably at least 20% by wt., to ensure an adequate mobility of the $SiO_2$ nanoparticles within the slip layer.

The manner how the slip layer is applied. The layer is preferably built up not successively in several sublayers, as is e.g. the case when the slip layer is sprayed on ("Aufsprühen"), but is produced in one operation, preferably by casting or spraying on ("Aufspritzen") and with a minimum thickness of 0.1 mm, preferably a minimum thickness of 0.3 mm. This provides, on the one hand, a sufficiently large reservoir of $SiO_2$ nanoparticles, and an excessively fast drying, of the layer is on the other hand prevented, which may counteract adequate segregation. When the layer is applied by casting or spraying on ("Aufspritzen"), the slip is applied either as a continuous jet, i.e. without division into individual drops, or with such a small division pulse that a reduction of the drop diameter of the slip below its balance size is avoided; it is at least 1 mm. Therefore, the liquid content of the slip is not significantly reduced when the slip layer is applied. The slip layer is here preferably given its end shape under the action of a tool, such as a doctor blade, a brush, an injection nozzle or a spatula. Through the spreading action of the processing tool the layer surface gets slightly more liquid, which facilitates the enrichment of $SiO_2$ nanoparticles also in the case of a relatively low liquid content. In this connection spray coating in comparison with casting or spraying on ("Aufspritzen") shows another disadvantage because due to the mechanical pulse during spraying suspension drops with small drop diameters are formed, in the case of which drying inevitably already starts in the flight phase to a considerable extent. The liquid content of, the slip layer formed by spraying therefore differs considerably from that of the initial slip. The loss of liquid cannot be easily compensated by raising the initial liquid content because of the segregation tendency that is then increasing.

An amount of $SiO_2$ nanoparticles that is high enough to effect a significant enrichment in the outer region of the slip layer—in the slip if is in the range from 2 to 15% by wt. and preferably less than 10% by wt. In contrast to the spray layer which is distinguished by a substantially homogeneous distribution of the particle sizes over the layer thickness, the slip layer is preferably inhomogeneous as it shows an inhomogeneous irregular course of the particle size distribution over the layer thickness, with an enrichment of $SiO_2$ nanoparticles in the near-surface region. In ceramic process engineering, these near-surface regions are also called "casting skin" and are often considered to be an indication of an undesired in homogeneity of the slip layer and are normally removed. Due to this enrichment the green layer can however be dense-sintered more easily and rapidly than without it. This means that dense sintering requires a lower sintering temperature and/or a shortened sintering duration than in the case of a slip layer with a homogeneous particle size distribution. At very great amounts of $SiO_2$ nanoparticles one can observe a tendency to the formation of cracks during drying or sintering.

The way how the dispersion liquid is removed—this is preferably done at a slow pace and in a targeted manner in the direction of the free surface, so that the escaping liquid can entrain $SiO_2$ nanoparticles upwards into the outer region. Preferably, the slip layer is dried in that the dispersion liquid is removed at a rate and in a direction in such a manner that under the action of the withdrawing dispersion liquid the fine fraction is enriched in the outer region of the slip layer, while forming a "casting skin", as shall be defined hereinafter in more detail.

A particularly homogeneous, dense and sinter-active near-surface volume portion with a relatively great amount of $SiO_2$ nanoparticles is thereby produced within the slip layer, the amount being higher than the average amount of the $SiO_2$ nanoparticles in the slip layer.

The enrichment of the finer $SiO_2$ particles and particularly of the fine fraction on the surface of the slip layer is visually perceivable as skin formation, which is here also called "casting skin". Visually, the slip layer possibly appears to be covered by a wax layer.

The casting skin is also visible after drying (in the green layer). The surface region of the green layer that shows a low porosity is here regarded as the casting skin. The thickness of said skin is preferably in the range of 3 to 15 μm, particularly preferably in the range of 5 to 10 μm. Furthermore, the casting skin is distinguished in that the fine fraction consisting of $SiO_2$ nanoparticles with particle sizes of less than 100 nm accounts for a volume proportion of the casting skin of more than 70%, preferably a volume proportion of more than 80%.

Normally, the $SiO_2$ nanoparticles are present in the casting skin not in isolated form, but in the form of aggregates or agglomerates that partly or completely embed the few $SiO_2$ particles of the coarse fraction. Since the porosity of the casting skin is low, the volume proportion corresponds approximately to the weight percentage of the $SiO_2$ nanoparticles. Thus, a volume proportion of more than 70% in the casting skin corresponds to an enrichment by more than 10 times in comparison with a typical initial slip having an average weight percentage of about 7% or less of $SiO_2$ nanoparticles.

It has been found that such a slip layer can be sintered reproducibly and under moderate sintering conditions (i.e., comparatively low sintering temperature and/or short sintering period) into a dense, transparent fused silica layer with a relatively low surface roughness. These moderate sintering conditions are normally fulfilled in the intended use of the crucible during heating of the silicon charge before the maximum temperature is reached in the crystal growing process, e.g. the melting temperature of the silicon (about 1,410° C.). A low closed porosity of preferably not more than 10% remains in the region of the former casting skin.

It has been found that such a thin, but dense surface layer already constitutes an efficient diffusion barrier particularly for iron.

As is generally known, while $SiO_2$ nanoparticles show a high sintering activity, which explains the comparatively low sintering temperature, they nevertheless effect on the other hand a high drying shrinkage at a high concentration, namely in lateral direction (in the layer plane), and can thereby lead to delamination of the layer and to the formation of cracks. The fact that these effects do not occur in the method according to the invention can be ascribed to a good interlocking between and remaining green layer through the rather large $SiO_2$ particles.

The final densification of the slip layer (or the green layer, respectively) not before the intended use of the crucible simplifies the manufacturing process and avoids an otherwise needed hot treatment process. Fundamentally, this does not rule out a thermal treatment of the green layer at a temperature below the maximum temperature in the crystal growing process, at which a certain densification can also take place, such as e.g. for sintering the crucible wall at a temperature below the cristobalite formation temperature or for burning-in a surface layer of $Si_3N_4$, which typically takes place below 1,200° C. However, repeated heating up of the green layer to high temperatures may lead to undesired interactions with adjoining layer regions, so that this procedure is in principle not advantageous.

It has been found that upon use of a crucible produced according to the invention for producing a silicon block in a Bridgman of VFG process, "red zone" and dark cell edge are considerably reduced or avoided.

The sintering activity of the slip layer or of the green layer, respectively, can be further enhanced if $SiO_2$ grains of synthetically produced transparent fused silica are used having a hydroxyl group content of at least 50 wt. ppm.

Amorphous synthetic $SiO_2$ grains are distinguished by high purity and show a lower viscosity at the same temperature in comparison with amorphous $SiO_2$ grains that have been produced from naturally occurring quartz raw material. The viscosity range of natural $SiO_2$ grains that is shifted towards elevated temperatures is partly due to the aluminum oxide typically contained therein. Synthetic $SiO_2$ grains are largely free of aluminum oxide. By contrast, hydroxyl groups (OH groups) additionally reduce the viscosity of transparent fused silica. Thus the viscosity profile shifts further to lower temperatures due to the use of OH-containing $SiO_2$ grains. As a consequence, the sintering process and thus also the densification of the layer start at comparatively low temperatures.

The $SiO_2$ content of the amorphous $SiO_2$ particles is preferably at least 99.99% by wt. Thus the solids content of the slip produced by using such $SiO_2$ particles consists of at least 99.99% by wt. of $SiO_2$. Binders or other additives are not provided. The total content of metallic impurities of the transition elements is preferably less than 5 wt. ppm, particularly preferably less than 2.5 wt. ppm, and the content of iron is less than 2 wt. ppm, preferably less than 1 wt. ppm, and particularly preferably less than 0.5 wt. ppm. This initial material does not pose any risk of contamination or crystallization. The cristobalite amount in the dried $SiO_2$ slip layer (=green layer) should be not more than 1% by wt. because, otherwise, the green layer might crystallize during sintering, which may impede densification and lead to waste of the crucible.

The smaller the iron content of the $SiO_2$ grains, the lower is the crystallization tendency of the grain layer during sintering and the smaller is the input into the silicon melt. The total iron content of the grains is therefore preferably less than 2 wt. ppm, preferably less than 1 wt. ppm, and particularly preferably less than 0.5 wt. ppm.

The dispersion liquid preferably has an aqueous basis. The polar nature of the aqueous phase may have an advantageous effect on the interaction of the $SiO_2$ particles.

It has turned out to be advantageous when the solids content of the dispersion is less than 80% by wt., preferably in the range between 70-80% by wt. and quite particularly preferably between 74 and 78% by wt.

This is a relatively low solids content, as is e.g. typical of spray slip. The spraying capacity requires low viscosity and thus a low solids content. On the other hand, such a small solids content is as such not desired because it may lead to an increased shrinkage of the slip layer and to the formation of cracks. The low solids content, however, makes it easier to transport $SiO_2$ nanoparticles into the outer region of the slip layer, so that it is preferred in the method according to the invention even if the dispersion is not used as a spray slip, but another application technique is used, such as spreading or application with a doctor blade on the inner wall of the crucible, which as such would allow the use of a dispersion having rather high solids contents.

Apart from the composition of the slip layer, the removal of the dispersion liquid is an important parameter for the formation of a dense casting skin. In this connection a measure is preferably taken that has the effect that the slip layer dries at a slower pace than without that measure.

A slowed-down drying can be achieved in the simplest case in that drying is carried out in an environment with moisture that is higher than is normally the case or at a comparatively low temperature. The temperature of the substrate is often raised for drying, e.g. to more than 100° C.; this rise in temperature can here be omitted. To ensure an adequate segregation of the $SiO_2$ nanoparticles on the surface and for the formation of a casting skin an initial drying period of at least 2 minutes, preferably at least 3 minutes, has turned out to be particularly useful.

In the simplest case the crucible base body is a commercially available solar crucible of porous transparent fused silica or porous opaque fused silica of average purity. As a rule, the crucible wall to be coated is therefore porous and absorbent. In this case, moistening before the application of the dispersion will be beneficial if a decrease in the drying rate is to be achieved. The preceding moistening also helps in this case to fill open or closed pores with liquid in advance, so that the suction effect thereof is reduced in the subsequent application of the slip layer, for the withdrawal of the dispersion liquid should take place as completely as possible towards the free surface, so that $SiO_2$ nanoparticles can be entrained by the liquid in that direction. In the case of a suction effect due to pores, $SiO_2$ nanoparticles would be transported away in the opposite direction. That is why the conceivable alternative, namely a raising of the liquid proportion of the dispersion for compensating for the suction effect, is quite ineffective and could moreover lead—because of the very great liquid proportion—to instability of the dispersion. The liquid for moistening the coating area is the dispersion liquid or another liquid. The porous coating area ensues e.g. from the porosity of the crucible base body or from the porosity of a surface layer of the crucible base body.

The absorbent crucible base body leads to a particularly intimate bond with the slip layer and the diffusion barrier layer to be produced therefrom. This facilitates the application of a uniformly thick slip layer, especially also on corners and edges and contributes to a homogeneous heat transition on the whole crucible surface.

It has also turned out to be advantageous when the slip layer is mechanically compacted or densified. Densification can be carried out directly upon application of the slip layer. Suitable methods produce compressive or shear forces in the layer, e.g. spreading or application with a doctor blade. With a mechanical densification the existing gap volume between the $SiO_2$ particles is reduced in size and the dispersion liquid contained therein is pressed out, thereby collecting on the free surface. In this process it can entrain $SiO_2$ nanoparticles and transport them to the surface of the slip layer. A liquid film which contains $SiO_2$ nanoparticles and which tends to form a casting skin during drying is thereby formed on the surface. Moreover, mechanical densification also yields a more intimate contact of the $SiO_2$ particles with one another, which effects an enhanced green strength of the slip layer after drying and improved interlocking with the inner wall of the crucible. The porosity remaining after drying of the slip layer is preferably less than 15%.

It has turned out to be useful when the slip layer is produced with a layer thickness of not more than 3 mm, preferably not more than 1.5 mm.

With layer thicknesses of the slip layer of more than 3 mm—just like, in the case of high weight percentages of $SiO_2$ nanoparticles of more than 10%, the risk of shrinkage cracks during drying and sintering rises. This can be explained by the fact that a certain penetration of the green layer with rather coarse $SiO_2$ particles that contribute to the interlocking of the casting skin and thereby counteract breakage during drying or sintering is important for preventing the formation of cracks. Therefore, the preferred thickness of the slip layer is not much higher than the $D_{50}$ value of the particle size distribution in the coarse fraction of the $SiO_2$ particles. The layer thicknesses obtained after drying of the slip layer into the green layer are advantageously within the range of 0.1 to 1.5 mm, preferably in the range of 0.5 to 1.5 mm, and particularly preferably in the range of 0.7 to 1 mm.

Preferably, the coarse fraction consists of splintery, amorphous $SiO_2$ grains with a grain size distribution having a $D_{50}$ value in the range between 3 μm and 30 μm.

The splintery $SiO_2$ grains contribute to the integrity of the slip layer and to the interlocking with the surface and improve the adhesion thereof. The effect regarding interlocking and improved adhesion is most easily achieved with a specific grain size distribution that has a $D_{50}$ value between 3 μm and 30 μm. A $D_{50}$ value of less than 3 μm results in a significantly increased drying shrinkage of the slip layer, and grains having a $D_{50}$ value of more than 30 μm counteract a high solid density in the slip, which also contributes to an increased drying shrinkage. The splintery grains are produced in the simplest way by grinding, preferably by wet grinding.

Preferably, use is made of a dispersion that is free of binders.

The entry of impurities into the slip is avoided in the absence of binders. Sintering is preferably carried out without the help of sintering aids. The layers produced thereby are distinguished by a high purity. $SiO_2$ contents of more than 99.99% are achieved. Above all alkali elements, which may occur either as a constituent or also as impurities in the binder additions, lead to the formation of cristobalite at elevated temperatures. Such devitrification processes can impede the densification in the sintering process.

As for the solar crucible for use in a crystal growing process, the above-indicated technical object, starting from a solar crucible of the aforementioned type that is provided with a grain layer, is achieved according to the invention on the one hand in that the $SiO_2$-containing layer is formed as a grain layer that contains amorphous $SiO_2$ particles which form a coarse fraction with particle sizes in the range between 1 μm and 50 μm and a fine fraction of $SiO_2$ nanoparticles with particle sizes of less than 100 nm, wherein the weight percentage of the $SiO_2$ nanoparticles in the grain layer is in the range between 2 and 15% by wt.

As for the purity and porosity, the crucible base body does not have to meet high demands. In the simplest case it is a commercially available solar crucible of porous transparent fused silica or porous opaque fused silica of average purity.

The inner wall of the solar crucible according to the invention is provided with a $SiO_2$-containing grain layer that, as intended, is thermally densified into the diffusion barrier layer only in the crystal growing process during heating up of the silicon.

On account of the tendency of the crucible base body to crystallize and because of the high temperatures, as are fundamentally needed for the densification of a grain layer having a high silicic acid content, the production of a dense diffusion barrier layer from $SiO_2$-containing grain layer before the intended use of the crucible encounters difficulties. To significantly reduce the "red zone" in the silicon block, low iron contents of less than 2.5 wt. ppm, preferably less than 0.5 wt. ppm, are needed. It has been found that this requires not only a dense diffusion barrier layer, but also that the density of the diffusion barrier layer upon heating up of the silicon charge must be achieved as rapidly as possible, i.e. before the melting temperature is reached.

Although sintering aids and binders contribute to a rapid sintering of the grain layer, they promote the tendency of the layer to crystallization at the same time and are therefore not suited. Nevertheless, in order to achieve a rapid and reliable densification of the diffusion barrier layer, the invention provides a very sinter-active grain layer. The high sinter activity thereof is achieved by way of a multimodal grain size distribution in the case of which amorphous $SiO_2$ particles with particle sizes in the range between 1 µm and 50 µm (coarse fraction) and $SiO_2$ nanoparticles (fine fraction) are provided with a weight percentage between 2 and 15% by wt. (weight percentages based on the solids content of the grain layer).

The sintering capacity of the grain layer depends particularly on the composition thereof in the near-surface region. The proportion of $SiO_2$ nanoparticles is here decisive. A high proportion yields an increased sintering activity that permits thermal densification at a comparatively low temperature or with a short sintering period into a glass of increased density and reduced porosity. Ideally, only relatively fine $SiO_2$ particles are found in the near-surface region of the grain layer.

The above-explained method of the invention leads to this kind of distribution of the $SiO_2$ particles within the grain layer by way of segregation. Within the grain layer this produces an inner region adjoining the inner wall of the crucible, in which the coarse fraction of the $SiO_2$ particles is predominantly found, and an outer region adjoining the free surface of the layer, in which the fine fraction is enriched. The fine fraction of the $SiO_2$ particles is formed by nanoparticles.

An inhomogeneous particle size distribution is found within the grain layer, with the transition between lower and upper region being not continuous or gradual, but rather distinct.

To achieve an adequately high amount of $SiO_2$ nanoparticles in the outer region of the grain layer, the amount of $SiO_2$ nanoparticles within the grain layer is on the whole in the range of 2-15% by wt, but because of shrinkage problems it is preferably less than 10% by wt.

In contrast to standard grain layers that are distinguished by a largely homogeneous distribution of the particles sizes over the layer thickness, the grain layer according to the invention is inhomogeneous as it shows a variation in the particle size distribution over the layer thickness, with an enrichment of $SiO_2$ nanoparticles in the near-surface outer region. On account of this enrichment it is easier to dense-sinter the grain layer than without said enrichment. This means that dense sintering requires a lower sintering temperature and/or a shortened sintering period than in the case of a grain layer with a homogeneous particle size distribution. With very high proportions of $SiO_2$ nanoparticles one will observe a tendency to the formation of cracks during drying or sintering.

A particularly homogeneous, dense and sinter-active near-surface volume portion with a relatively high proportion of $SiO_2$ nanoparticles manifests itself within the grain layer. In the near-surface volume portion their proportion is thus higher than the mean proportion of the $SiO_2$ nanoparticles in the remaining grain layer.

The near-surface volume portion shows a low porosity. The thickness is preferably in the range of 3-15 µm, particularly preferably in the range of 5-10 µm. In the near-surface volume portion the fine fraction consisting of $SiO_2$ nanoparticles with particle sizes of less than 100 nm accounts for a volume proportion of more than 70%, preferably a volume proportion of more than 80%.

It has been found that such a grain layer can be sintered reproducibly and under moderate sintering conditions (i.e., comparatively low sintering temperature and/or short sintering period) into a dense, translucent fused silica layer with a relatively low surface roughness. These moderate sintering conditions are regularly met in the intended use of the crucible during heating of the silicon charge before the maximum temperature is reached in the crystal growing process, e.g. the melting temperature of the silicon (about 1,410° C.). A thin layer with a low and closed porosity of preferably not more than 10% remains here in the area of the former near-surface volume portion. This percentage value approximately marks the transition between open porosity (>10%) and closed porosity (<10%). Therefore, a material with a porosity of less than 10% is here called "dense". It has been found that such a thin, but dense surface layer already represents an efficient diffusion barrier for iron.

The final densification of the grain layer only during the intended use of the crucible simplifies the manufacturing process and avoids an otherwise needed hot treatment process. This does not rule out that the grain layer has already been subjected to high temperatures before, e.g. for sintering the crucible wall at a temperature below the cristobalite formation temperature or for burning-in a surface layer of $Si_3N_4$, which is typically done below 1,200° C. However, a repeated heating up of the grain layer to high temperatures may lead to undesired interactions with adjoining layer portions, so that this is not preferred.

It has been found that in the use of a solar crucible according to the invention for producing a silicon block in a Bridgman or VGF process, "red zone" and dark cell edge can be reduced considerably or avoided.

It has turned out to be useful when the fine fraction within a near-surface volume portion of the grain layer is enriched such that $SiO_2$ nanoparticles account for a volume proportion of more than 70%, preferably a volume proportion of more than 80%.

Normally, the $SiO_2$ nanoparticles are present in the near-surface volume portion of the grain layer not in isolated form, but in the form of aggregates or agglomerates that partly or completely embed the few $SiO_2$ particles of the coarse fraction. Since the porosity in the near-surface volume portion is small, the volume proportion corresponds approximately to the weight percentage of the $SiO_2$ nanoparticles.

Thus, a volume proportion of more than 70% corresponds to an enrichment by more than 10 times in comparison with the typical proportion of about 7% of $SiO_2$ nanoparticles in the near-surface volume portion of the grain layer.

Advantageous developments of the solar crucible according to the invention follow from the sub-claims. Insofar as developments of the solar crucible indicated in the sub-claims copy the procedures indicated in sub-claims with respect to the production method according to the invention, reference is made for supplementary explanation to the above statements regarding the corresponding method claims.

On the other hand, the above-indicated technical object of the invention is achieved with respect to the solar crucible for use in a crystal growing process starting from a solar crucible of the aforementioned type provided with a grain layer, also in that the $SiO_2$-containing layer is configured as a diffusion barrier layer which has a porosity of less than 10%, a thickness in the range of 0.1-1.3 mm, and a content of iron of less than 2 wt. ppm.

In this embodiment of the solar crucible according to the invention, the SiO$_2$-containing layer is configured as a dense diffusion barrier layer. Density is given when the diffusion barrier layer is dense at least in a near-surface region, in the sense that the near-surface region shows no open porosity, but at best closed porosity.

Open porosity of a material manifests itself in that it is absorbent, which can be verified by way of a dye penetration test. The absence of open pores is assumed in the case of a porosity of less than 10%. Therefore, a material with a porosity of less than 10% is here called "dense". The dense diffusion barrier layer—without open porosity—reduces the comparatively rapid surface diffusion—especially of iron—and permits only the comparatively slower volume diffusion.

To enable the diffusion barrier layer to be operative as such, it is enough when the dense near-surface region has a thickness of a few micrometers. Thus, for instance a thin, but dense surface region of the diffusion barrier, layer of less than 100 µm or even less than 80 µm already represents an efficient diffusion barrier for iron. The thickness of the dense sintered diffusion barrier layer on the whole is however much greater due to the manufacturing process and is in the range of 0.1-1.3 mm, preferably in the range of 0.4-1.3 mm, and particularly preferably in the range of 0.6-0.9 mm.

Moreover, the diffusion barrier layer has low iron contents of less than 2.5 wt. ppm, preferably of less than 1 wt. ppm, and particularly preferably of 0.5 wt. ppm.

It has been found that upon use of the solar crucible according to the invention for producing a silicon block in a Bridgman or VGF process, both the "red zone" in the silicon block and the "dark edge" can be reduced significantly or avoided.

As for the method for producing a silicon block in a crystal growing process by providing a solar crucible with a crucible base body of transparent or opaque fused silica comprising an inner wall, of which at least a part is covered by a SiO$_2$-containing grain layer, the aforementioned technical object is achieved according to the invention in that use is made of a solar crucible in which the grain layer contains amorphous SiO$_2$ particles that form a coarse fraction with particle sizes in the range between 1 µm and 50 µm and a fine fraction of SiO$_2$ nanoparticles with particle sizes of less than 100 nm, wherein the weight percentage of the SiO$_2$ nanoparticles on the grain layer is in the range between 2-15% by wt., and that the SiO$_2$-containing grain layer is thermally densified upon heating up of the silicon.

In the simplest case the crucible base body is a commercially available solar crucible of porous transparent fused silica or porous opaque fused silica of average purity. The inner wall thereof is provided completely or partly with a SiO$_2$-containing grain layer in advance, i.e. before the filling in of a silicon charge. The above-explained manufacturing method is suited for the production of the solar crucible provided with the grain layer. Optionally, the grain layer can additionally be covered with a releasing agent layer, e.g. with Si$_3$N$_4$ as the releasing agent.

After loading with the silicon charge the solar crucible is heated up in the standard way. Depending on the crystal growing method, the filled-in silicon is completely fused, or only a silicon melt is produced above a solid seed crystal arranged on the crucible bottom. In the last-mentioned case, the bottom region of the solar crucible is kept at a temperature below the melting temperature of silicon, e.g. at a temperature of 1375° C. The heating energy is normally coupled in via resistance heaters which are arranged outside the solar crucible and which form a plurality of heating zones that can be adjusted separately. After homogenization of the melt the cooling phase begins to start an oriented crystallization.

During the heating-up phase, the grain layer is dense-sintered. Densification is ideally completed before the maximum temperature is reached. It has turned out to be useful when the grain layer has reached a density of more than 90%, preferably at least 93%, of its theoretical density before the silicon melt is formed.

The dense-sintered grain layer forms an efficient diffusion barrier layer; it reduces the in-diffusion of impurities from the crucible wall into the silicon melt and the evolving silicon block.

In the fusion and crystallization process the contaminated opaque fused silica of the crucible base body crystallizes into cristobalite, whereas the grain layer remains vitreous. During cooling the phase transformation of the cristobalite and the associated volume change of 2.8% leads to a breakage of the base body.

The silicon block of the invention which has been produced according to the above-explained method using a diffusion barrier layer with the help of a Bridgman or VGF process is distinguished by low material losses. In comparison with a standard process without diffusion barrier layer, both the "red zone" and the "dark edge" (determined with the measurement methods LTLD and PL specified at the outset) are significantly reduced.

PREFERRED EMBODIMENTS

Figure 2:
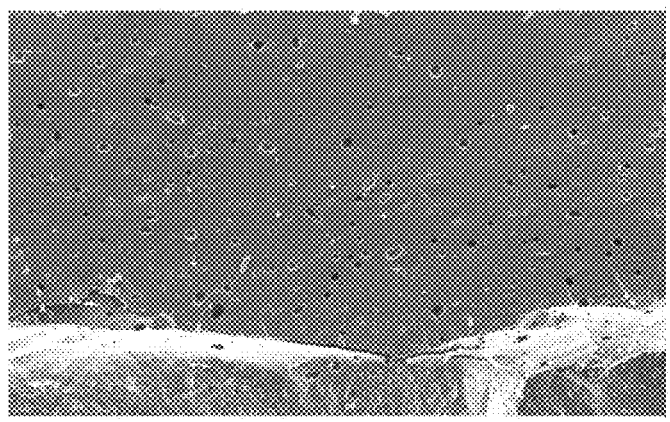
Figure 3:
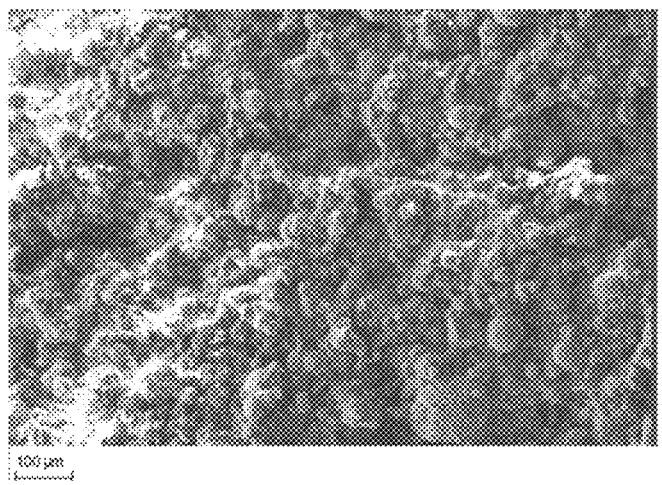
Figure 4:
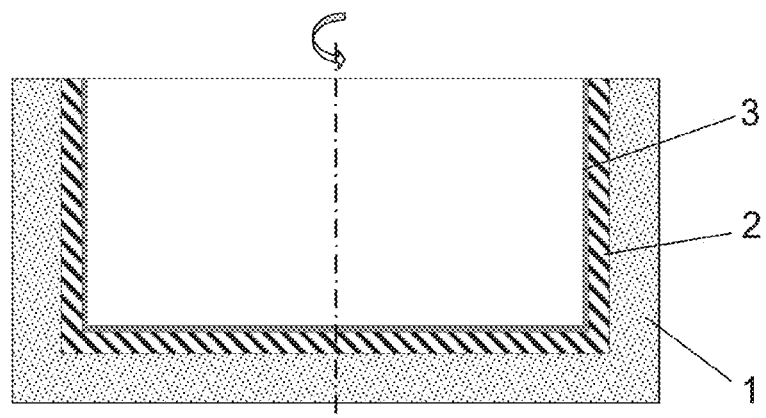
Figure 5:
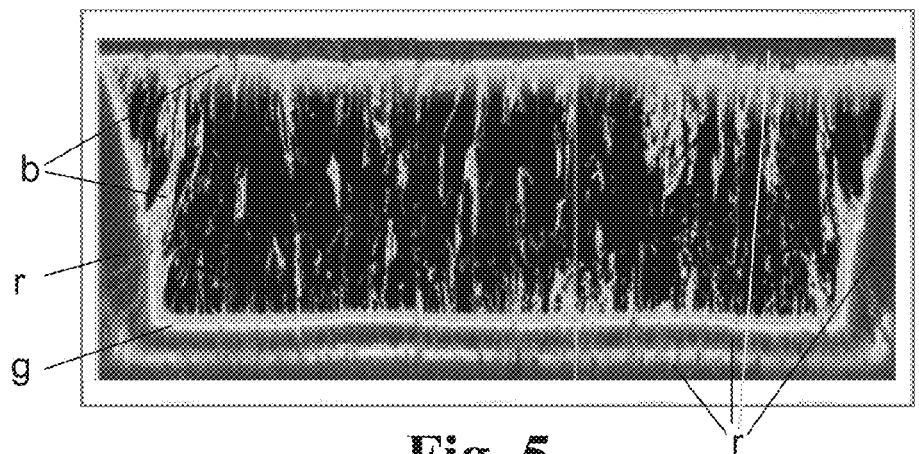
Figure 6:
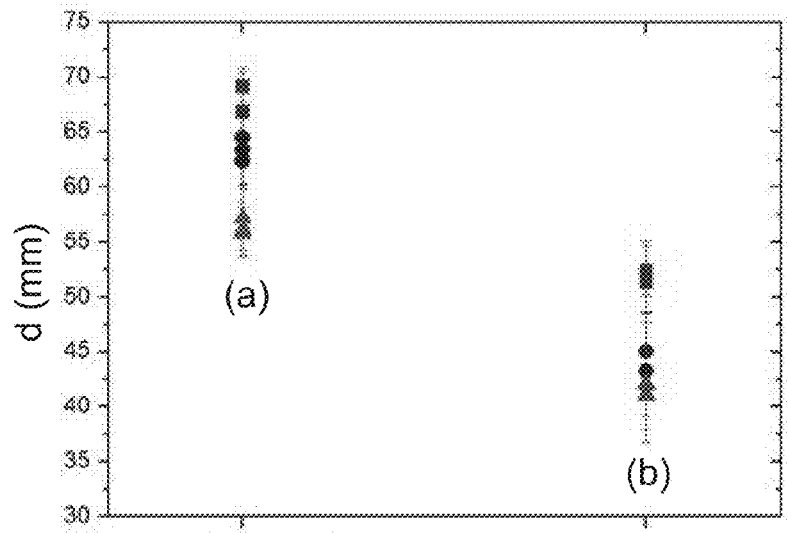

The invention will now be explained in more detail with reference to embodiments and a drawing. In detail, FIG. 1 shows an SEM image of a sintering sample of a fused silica plate with an SiO$_2$ barrier layer applied thereto as a slip, after a sintering period of 3 h at 1,300° C., FIG. 2 shows an SEM image of a sintering sample of a fused silica plate with an SiO$_2$ barrier layer applied thereto as a slip, after a sintering period of 3 h at 1,500° C., FIG. 3 is a photo of a green layer in a reference sample, FIG. 4 is a schematic representation showing a fused silica crucible provided with a grain layer according to the invention, in a side view, FIG. 5 is an MDP (microwave detected photoconductivity) image of the charge carrier lifetime in a typical silicon block, cut vertically, FIG. 6 shows a comparison of the thicknesses of lateral in-diffusion layers determined by means of MDP measurements, in silicon blocks produced by means of solar crucibles with and without diffusion barrier layer, FIG. 7 shows results of photoluminescence measurements of silicon cells from the corner portion, produced with and without diffusion barrier layer, FIG. 8 is a diagram with concentration curves of the total iron concentration, measured on several polished structural samples in a direction transverse to the layer, and FIG. 9 is a diagram with results of GDMS measurements on silicon blocks.

PREPARATION OF A SIO$_2$ SLIP—FIRST ALTERNATIVE

Amorphous transparent fused silica grains are mixed into a dispersion liquid in a drum mill lined with transparent fused silica. The transparent fused silica grains consist of transparent fused silica that has been produced from naturally occurring raw material and have grain sizes in the range between 250 µm and 650 µm. This mixture is ground by means of grinding balls of transparent fused silica on a roller block at 23 rpm for a period of 3 days such that a homogeneous slip is formed. In the course of the grinding process the pH is lowered to about 4 due to the dissolving $SiO_2$.

The $SiO_2$ grain particles obtained after the grinding of the transparent fused silica grains are of a splintery type and show a particle size distribution that is distinguished by a $D_{50}$ value of about 8 μm and by a $D_{90}$ value of about 40 μm. $SiO_2$ nanoparticles with diameters of about 40 nm ("fumed silica") with a weight percentage of 10% by wt. (based on the solids content of the dispersion) are added to the homogeneous slip. After further homogenization a binder-free $SiO_2$ slip is obtained. The solids content of the dispersion is 75% by wt.; the $SiO_2$ content of the amorphous $SiO_2$ particles is at least 99.99% by wt., and the total content of metallic impurities of the transition elements is less than 2.5 wt. ppm. The content of iron is below 0.5 wt. ppm.

PREPARATION OF A $SiO_2$ SLIP—SECOND ALTERNATIVE

Instead of the transparent fused silica grains of naturally occurring raw material, use is made of $SiO_2$ grains of synthetically produced transparent fused silica that has a hydroxyl group content of about 800 wt. ppm. These $SiO_2$ grains are commercially available in a high-purity form and in different grain sizes. The $SiO_2$ content of the amorphous $SiO_2$ particles is at least 99.99% by wt. and the total content of metallic impurities of the transition elements is less than 1 wt. ppm. The content of iron is below 0.1 wt. ppm.

The dispersion of deionized water and, amorphous $SiO_2$ grains with a mean particle size of about 15 μm ($D_{50}$ value) is homogenized without grinding balls. $SiO_2$ nanoparticles with diameters of about 40 nm ("fumed silica") are added to the homogeneous slip. After further homogenization a binder-free $SiO_2$ slip is obtained, in which the $SiO_2$ nanoparticles have a weight percentage of 8% by wt. (based on the solids content of the dispersion), the total solids content of the dispersion being 75% by wt.

Preliminary Test—Sample 1

The crucible material of opaque fused silica has an open porosity and forms an absorbent substrate for slip casting. On this material (body), a slip layer is produced from the binder-free slip by application with a doctor blade (also called "casting"). In this process a $SiO_2$ slip layer with a thickness of about 1 mm is applied with a doctor blade onto the horizontally supported plate, and directly thereafter a mechanical pressure is exerted on the slip layer by means of the doctor blade device.

A thin liquid film forms on the densified slip layer applied in this way and a homogeneous and closed surface layer is formed during subsequent surface drying in air.

This creates a body structure which macroscopically leads to the formation of a dense layer of uniform thickness which as a green layer and also as a sinter layer in the sintered state forms an intimate adhesive bond with the crucible substrate. A high segregated fine fraction in the upper portion of the layer (casting skin) can be seen under the microscope. Within, the casting skin, the fraction of fine $SiO_2$ particles and particularly of $SiO_2$ nanoparticles is much higher than in the remaining slip layer.

The manner of applying the complete layer thickness in one operation provides, on the one hand, a sufficiently large reservoir of $SiO_2$ nanoparticles, which is suited for segregation on the surface, and an excessively fast drying of the layer in air is prevented on the other hand, which otherwise would counteract segregation and formation of the casting skin. Consequently, this leads to a slower drying of about 3-5 min and a solidification of the slip layer into the supporting layer which permits the formation of a substantially smooth casting skin.

During casting the slip layer is given its final shape by the action of a tool, such as a doctor blade, a brush, a spatula, or an outlet nozzle from which during application a continuous slip jet exits. Owing to the spreading action of the processing tool the layer surface becomes slightly more liquid, which facilitates the enrichment of $SiO_2$ nanoparticles also at a comparatively low liquid content. This outcome, i.e., no significant reduction of the liquid content of the slip, can also be expected from other application techniques (such as spraying on ("Aufspritzen")), in which the slip layer is produced with its whole thickness at once and without division into fine drops of less than 1 mm.

The slip layer produced in this way is dried within 3 minutes into a supporting layer and subsequently dried—still at a slow pace—by being allowed to stand in air for 1 hour. The casting skin is here given a wax-like appearance. The complete drying is carried out in air for 4 to 8 hours by using an IR radiator.

The dried slip layer has a mean thickness of about 0.8 mm. It is also called "green layer". The $SiO_2$ nanoparticles enriched in the surface region of the green layer show a high sinter activity and improve the densification of the layer. FIG. 1 shows the layer produced in this manner after sintering for three hours in a sintering furnace at a temperature of around 1,300° C. Complete densification is not yet achieved in this process. The rough rugged fracture surface with many finely distributed pores can clearly be seen.

By comparison, FIG. 2 shows the appearance of a similar sinter layer after sintering for three hours at an elevated temperature of 1,500° C. A crack-free and substantially smooth, strongly densified and vitrified fracture surface of opaque fused silica with a density of about 2.1 g/cm³ is obtained. The surface layer shows a closed porosity of less than 5% and a thickness of about 750 μm. (Note: The transition from open to closed porosity is in the range of 5-10% according to the literature).

Neither the layer of FIG. 1 nor the layer of FIG. 2 hints at possible crystallization products, neither in the inside nor on the surface.

The high sinter activity of the grain layer produced according to the invention is apparent from the details given in Table 1. Here, sinter duration and sinter temperature and the respective sinter result are summarized in a crosstab.

TABLE 1

|  | 0.5 h | 1 h | 3 h | 5 h |
| --- | --- | --- | --- | --- |
| 1,300° C. | opaque/porous | opaque/porous | opaque/porous | opaque/porous |
| 1,350° C. | opaque/porous | opaque/porous | opaque/porous | opaque/porous |
| 1,375° C. | opaque/porous | opaque/porous | translucent/dense | translucent/dense |
| 1,400° C. | translucent/dense | translucent/dense | translucent/dense |  |
| 1,450° C. |  |  | translucent/dense |  |

"Opaque/porous" means that the necessary density of the layer is missing and that this layer is not suited as a diffusion barrier layer within the meaning of the invention. The porosity is more than 10% and the density is less than 90% of the theoretical density of transparent fused silica (about 2.2 g/cm$^3$).

"Translucent/dense" means that the densified sinter layer has a density of at least 90%, preferably at least 95%, of the theoretical density, so that it is suited as a diffusion barrier layer within the meaning of the invention.

In crystal growing processes the crucible wall is heated up to temperatures in the range between 1,375° C. and about 1,450° C. On the assumption that when a silicon charge is heated up in a crucible, at least one hour will typically pass until the maximum temperature is reached, the grain layer normally has the status "translucent/dense" and has thus reached a density of at least 95% of its theoretical density. This is only true to some extent for the maximum temperature of 1,375° C. which the crucible bottom has in the so-called "quasi mono process". In this case the desired density of the grain layer will only be reached after 3 hours.

Reference Example—Sample 2

The above-described, binder-free SiO$_2$ slip has a low viscosity and can be used as such directly as a spray slip. In a test this slip was used for producing a spray coating on the absorbent, opaque fused silica body with open porosity.

For coating purposes the opaque fused silica plate was introduced in horizontal orientation into a spay chamber and the top side was successively provided by spraying of the slip with a supporting SiO$_2$ slip layer having a thickness of about 0.7 mm. A spray gun which is continuously supplied with the spray slip was used for this purpose.

A rough and rugged surface layer is formed on the successively applied slip layer during subsequent surface drying in air within one minute. This result is at any rate partly due to the fact that the drying of the slip layer took place so rapidly because of the porous substrate that a segregation of the fine fraction in the upper region of the slip layer was not possible, so that a dense and closed casting skin could not form.

The further drying process then took place at a slow pace in that the slip layer was allowed to stand in air for eight hours. Complete drying is carried out in air for 4 hours by using an IR radiator.

This yields a rough and cracked inhomogeneous surface layer of opaque, porous fused silica which has the appearance shown in FIG. 3.

The dried green layer could subsequently be sintered in a sintering furnace at a temperature of about 1,410° C. into a densified sinter layer of translucent fused silica with a density of about 2.0 g/cm$^3$. This density is still acceptable for a diffusion barrier layer.

Coating of a Crucible

The coating of a commercially available opaque fused silica crucible 1, produced from transparent fused silica of naturally occurring raw material, took place in a multistage setup, which is schematically shown in FIG. 4.

The SiO$_2$ grain layer 2 to be formed for the diffusion barrier is applied on all sides (bottom and sidewalls) to a pre-moistened inner wall of the crucible 1 of porous opaque fused silica which is temperature-controlled to room temperature. Layers of different thickness and geometrical design can thereby be produced. In the embodiment the grain layer was produced by using the above-described SiO$_2$ slip layer—first alternative—and on the basis of the method described in the preliminary test—sample 1—for application (by doctor blade) and drying of the slip layer. The green layer (=grain layer 2) produced in this way shows a largely uniform average thickness of about 0.8 mm after drying. The thickness of the diffusion barrier layer obtained therefrom after sintering (in the crystal growing process) is about 10% smaller and is thus about 0.7 mm. After application of said grain layer 2 the layer was coated with a suspension of silicon nitride, silica and DI water (layer 3).

The coated opaque fused silica crucible was used in a crystal growing process which shall be explained in more detail hereinafter. The grain layer was here sintered and thus thermally densified into a dense diffusion barrier layer with a mean thickness of about 0.6 mm.

Production of a Silicon Block

Crystal growing for producing a silicon block was carried out by using the coated opaque fused silica crucible and otherwise in a standard process as e.g. described in DE 10 2005 013 410 B4.

During heating in the crystal growing process a densified SiO$_2$ barrier layer with an average thickness of about 0.6 mm and a porosity of less than 10% evolves from the grain layer. This barrier layer shows no open porosity and is efficiently active as a diffusion barrier layer with respect to the fast surface diffusion of impurities, especially of iron.

Measurement Results

FIG. 5 shows a typical cross-section of the silicon block, measured by means of "MDP" ("microwave detected photoconductivity"). With this measurement method the minority charge carrier lifetime (LTLD) is determined in a semiconductor material. The minority charge carrier lifetime is normally illustrated in a false-color representation—in FIG. 5 the illustration is kept in gray scales and the gray values correspond to the actually colored regions supplemented with the details "g" (green), "b" (blue) and "r" (red). A long charge carrier lifetime is assigned to the green and blue measurement points. The false-color representation is scaled such that the red color is assigned to the zones with a short charge carrier lifetime (LTLD<6 µs). Thus, the zones colored in red represent the in-diffusion zones with short charge carrier lifetime. They represent the inferior material region, which is here called "red zone". The cake thickness to be removed depends on the thickness of the red zone.

The "red zone" can clearly be seen on the bottom and in the lateral block regions; it is here predominantly caused by solid-state diffusion of impurities from the solar crucible.

The diagram of FIG. 6 shows a comparison of the in-diffusion zones made visible by way of MDP measurements for a silicon block from a crucible without diffusion barrier layer (measurement series (a)) and for a silicon block from a crucible with diffusion barrier layer (measurement series (b)). On the ordinate, width d of the lateral in-diffusion zone which is measured at several height positions of the silicon block is here respectively plotted (in mm). The measurement points of about the same height position of both measurement series are respectively represented as triangles, circles and squares.

It is apparent therefrom that in the silicon block from the crucible with diffusion barrier layer (measurement series b) both the lateral in-diffusion zone on the whole and the area of short charge carrier lifetime (red zone) are comparatively thin.

FIG. 7 shows representations of processed corner wafers in which the cell efficiency is made visible by way of photoluminescence. The two corner wafers are taken from silicon blocks of the same block height. The wafer shown in figure (a) derives from a silicon block which was produced in a crucible without diffusion barrier. The corner wafer shows two dark edge regions that have a lower charge carrier concentration due to harmful in-diffusion. The corner wafer according to figure (b) derives from a block with diffusion barrier. In this wafer, the dark edge region is much smaller.

In the iron concentration profiles of FIG. 8, the concentration of iron $C_{Fe}$ is plotted in wt. ppm against the measurement position P (in µm). The profiles were measured on polished cross sections of the coated crucible after completion of a crystal growing process.

The total concentration of the iron contamination was determined by inductively coupled plasma mass spectrometry (ICP-MS). The samples designated with "SL1" and "SL2" were prepared by means of crucibles with slip-based diffusion barrier layer according to the invention. In the comparative sample designated with "PLA", the diffusion barrier layer was produced by using insertion plates of transparent fused silica, as described in the above-mentioned DE 10 2011 082 628 A1. The value zero on the x-axis marks the boundary between the crucible wall (substrate S) and the respective diffusion barrier layers (L).

It can be seen that the diffusion barrier layers L after the Si melting process show much lower Fe concentrations than the crucible material (substrate). A diffusion profile is perceivable. The higher concentration level of the slip-based layers (SL1 and SL2), which originally during application were much purer (Fe level about 0.2 wt. ppm, i.e. similar to the concentration level of the plate sample), is noteworthy. This is an indication that a certain enrichment with Fe that penetrates through the whole layer already occurs during the heating up or densification, respectively, of the sample. This leads to an essential technical demand for a densification of the layer that is as fast as possible.

It is noteworthy that the $SiO_2$ initial slip has a Fe initial concentration that corresponds approximately to the asymptotic level of the $SiO_2$ plate material ("PLA"). The fact that the Fe concentration level after the melting process has risen slightly above 1 ppm is indicative of an enrichment of the whole layer during the densification process. Since it must be presumed that the layer which is strongly densified at the end probably shows a similar behavior as the plate material that is dense right from the beginning, this is in support of the assumption that the initial porosity promotes this enrichment, and of the conclusion that the material should densify at temperatures that are as low as possible (below 1410° C.).

FIG. 9 shows results of a GDMS measurement (glow discharge mass spectrometry) for a silicon reference block (called "Ref") produced without a diffusion barrier layer and a silicon block (called "SL") produced with a diffusion barrier layer according to the invention, by way of comparison. On the ordinate of the diagram, the respective metal content (iron, copper) $C_{Me}$ is here plotted in wt. ppm on a logarithmic scale against the distance A (in mm) from the crucible wall. It is apparent therefrom that the metal concentration is decreasing with an increasing distance and that a reduction of the iron and copper content in the finished silicon block could be achieved by using the $SiO_2$ diffusion barrier. It is striking that in the sample according to the invention with a diffusion barrier layer for iron (SL-Fe) it is not only the edge concentration but also the whole profile that is clearly lower than in the reference sample (Ref-Fe) without diffusion barrier layer.

The invention claimed is:

1. A method for producing a solar crucible with a rectangular shape for use in a crystal growing process for silicon, the method comprising:
   providing a crucible base body of transparent or opaque fused silica comprising an inner wall;
   providing a dispersion containing amorphous $SiO_2$ particles;
   applying a $SiO_2$-containing slip layer with a layer thickness of at least 0.1 mm to at least a part of the inner wall by using the dispersion;
   drying the slip layer so as to form a $SiO_2$-containing grain layer having a casting skin; and
   thermally densifying the $SiO_2$-containing grain layer so as to form a diffusion barrier layer,
      wherein the dispersion contains a dispersion liquid and the amorphous $SiO_2$ particles that form a coarse fraction with particle sizes in the range between 1 µm and 50 µm and a fine fraction with $SiO_2$ nanoparticles with particle sizes of less than 100 nm, the fine fraction with the $SiO_2$ nanoparticles with particle sizes of less than 100 nm accounting for a volume proportion of the casting skin of more than 70%,
      wherein a weight percentage of the $SiO_2$ nanoparticles based on a solids content of the dispersion is in the range between 2 and 15% by wt., and
      wherein the $SiO_2$-containing grain layer is thermally densified into the diffusion barrier layer through heating up of the silicon in the crystal growing process.

2. The method according to claim 1, wherein the solids content of the dispersion is less than 80% by wt.

3. The method according to claim 1, wherein the dispersion is free of binders, wherein the $SiO_2$ content of the amorphous $SiO_2$ particles is at least 99.99% by wt., and wherein a total content of metallic impurities of transition elements is less than 5 wt. ppm.

4. The method according to claim 1, wherein the slip layer is applied by casting the dispersion onto the inner wall.

5. The method according to claim 1, wherein the inner wall is moistened prior to the application of the slip layer, and wherein the inner wall of the crucible base body is a porous inner wall.

6. The method according to claim 1, wherein a green layer obtained after drying of the slip layer has a layer thickness in the range of 0.1-1.5 mm.

7. A method for producing a silicon block in a crystal growing process comprising:
   providing a solar crucible with a crucible base body of transparent or opaque fused silica comprising an inner wall, of which at least a part is covered by a $SiO_2$-containing grain layer having a casting skin; and
   filling the solar crucible with silicon, the silicon being heated so as to form a silicon melt, the silicon melt being cooled down with crystallization and formation of the silicon block,
      wherein the $SiO_2$-containing grain layer contains amorphous $SiO_2$ particles that form a coarse fraction with particle sizes in the range between 1 µm and 50 µm and a fine fraction of $SiO_2$ nanoparticles with particle sizes of less than 100 nm, the fine fraction of $SiO_2$ nanoparticles with particle sizes of less than 100 nm accounting for a volume proportion of the casting skin of more than 70%,
      wherein the weight percentage of the $SiO_2$ nanoparticles of the $SiO_2$-containing grain layer is in the range between 2 and 15% by wt., and
      wherein the $SiO_2$-containing grain layer is thermally densified during heating up of the silicon.

8. The method according to claim 7, wherein before the formation of the silicon melt, the $SiO_2$-containing grain layer has reached a density of more than 90% of its theoretical density.

* * * * *